United States Patent
Hirigoyen

(10) Patent No.: US 9,299,733 B2
(45) Date of Patent: Mar. 29, 2016

(54) IMAGE SENSOR

(71) Applicant: STMicroelectronics (Grenoble 2) SAS, Grenoble (FR)

(72) Inventor: Flavien Hirigoyen, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 14/660,404

(22) Filed: Mar. 17, 2015

(65) Prior Publication Data
US 2015/0349010 A1 Dec. 3, 2015

(30) Foreign Application Priority Data
Jun. 2, 2014 (FR) ...................................... 14 54969

(51) Int. Cl.
*H01L 27/146* (2006.01)
*H01L 31/0232* (2014.01)

(52) U.S. Cl.
CPC .... *H01L 27/14625* (2013.01); *H01L 27/14629* (2013.01)

(58) Field of Classification Search
CPC .......................... H01L 27/146; H01L 31/0232
See application file for complete search history.

(56) References Cited

U.S. PATENT DOCUMENTS

| 2005/0052724 A1* | 3/2005 | Suzuki et al. ................. 359/305 |
| 2008/0087800 A1* | 4/2008 | Toda ......................... 250/214 C |
| 2012/0145084 A1* | 6/2012 | Crawshaw ................. 119/14.47 |

FOREIGN PATENT DOCUMENTS

| WO | WO-2008002390 A1 | 1/2008 |
| WO | WO-2012018887 A2 | 2/2012 |
| WO | WO-2012058360 A2 | 5/2012 |

OTHER PUBLICATIONS

INPI Search Report and Written Opinion or FR 1454969 dated Oct. 6, 2014 (6 pages).

* cited by examiner

*Primary Examiner* — Marc Armand
(74) *Attorney, Agent, or Firm* — Gardere Wynne Sewell LLP

(57) ABSTRACT

An image sensor is formed by a pixel array including a plurality of pixels. Certain ones of the pixels include, above their active areas, a first optical grating formed of periodically spaced apart parallel strips separated from the active area by a first insulator. Those pixels further include, in another metal level, a second optical grating formed of periodically spaced apart parallel strips separated from the first grating by a second insulator. The second optical grating is laterally shifted with respect to the first grating in a direction orthogonal to a longitudinal direction of the parallel strips.

20 Claims, 5 Drawing Sheets

IMAGE SENSOR

PRIORITY CLAIM

This application claims the priority benefit of French Patent application number 1454969, filed on Jun. 2, 2014, the contents of which is hereby incorporated by reference in its entirety to the maximum extent allowable by law.

TECHNICAL FIELD

The present disclosure relates to an image sensor, and more particularly to the structure of certain pixels of an image sensor.

BACKGROUND

An image sensor is essentially formed of an array of pixels comprising "normal" pixels and self-focusing pixels formed in a semiconductor substrate. A self-focusing pixel is a pixel intended to only receive light arriving under a given incidence. Based on pixels receiving light under different incidences, a focusing determination can be performed. Conventional self-focusing pixels comprise screens covering substantially complementary portions of the photodiodes of these pixels, for example, a right-hand portion and a left-hand portion.

FIG. 1 is a cross-section view showing the structure of a self-focusing pixel 11 screened to the left of an image sensor. Pixel 11 comprises an active photodiode area 15 formed in the upper part of a portion of a semiconductor substrate 13. Active area 15 does not entirely cover the substrate portion associated with pixel 11. Indeed, part of the surface is reserved to elements (not shown) for addressing the pixel and reading therefrom.

Substrate 13 is covered with an interconnection network, where metal levels and vias are separated by transparent insulating layers 17. For example, in a first metal level, deposited at the surface of substrate 13, tracks 19 and 21 are formed. Track 19 is arranged so as not to cover active area 15 while track 21 is prolonged by a screen 26 covering the left-hand half of active area 15. Tracks 23 are formed in a second metal level. Vias 25 are formed through insulating layers 17 to connect the two metal levels. Further, in a color sensor, a color filter 27 is arranged above the stack of insulating layers 17, opposite to the portion of substrate 13 associated with pixel 11. Filter 27 is generally covered with an intermediate equalization layer 28.

To concentrate the light intensity received at the surface of pixel 11 towards active area 15, a microlens 29 is arranged at the surface of intermediate layer 28, opposite to the substrate portion associated with pixel 11.

FIG. 2 is a cross-section view showing the structure of a self-focusing pixel 31 screened on the right-hand side of an image sensor. The structure of pixel 31 is identical to that of pixel 11. However, track 21 is arranged so as not to cover active area 15 while track 19 is prolonged by a screen 33 covering the right-hand half of active area 15.

FIG. 3 corresponds to FIG. 1 of French patent No. 2945666 (incorporated by reference). This drawing is a very simplified cross-section view of a square or rectangular image sensor 41 arranged in the focal plane of a lens 43. Sensor 41 is essentially formed of an array of pixels formed in a semiconductor substrate. A pixel 45 and a pixel 47, respectively arranged at the center and at the border of sensor 41, are shown as an example. As illustrated by the light paths shown in full lines and in dotted lines, pixel 45 receives rays centered on an angle of incidence close to 0°, while the pixels placed at the sensor border, and particularly in the corners, such as pixel 47, receive rays centered on a non-zero angle of incidence.

FIG. 4 corresponds to FIG. 3A of French patent No. 2945666. This drawing is a cross-section view showing the structure of a "normal" pixel 51 of image sensor 41. The structure of pixel 51 is identical to the structure of pixels 11 and 31, excluding screens 26 and 33. The shown light path corresponds to the case of a non-zero average angle of incidence, that is, to a pixel located in a peripheral area of the sensor. The focusing point of the microlens for such rays is off-centered with respect to active area 15, which results in a degradation of the sensor sensitivity (vignetting phenomenon). It is desired to address this problem in the prior art. In this patent application, it is accordingly provided to replace conventional lens 31 with an asymmetrical lens. The asymmetrical lens is manufactured so that the received rays converge towards the center of active area 15.

It is desired to more simply manufacture self-focusing pixels and normal pixels located at the border of an array.

SUMMARY

Thus, an embodiment provides an image sensor comprising a pixel array, wherein pixels comprise above their active area, in a first metal level, a first optical grating formed of periodically spaced apart parallel strips and separated from the active area by a first insulator; and in another metal level, a second optical grating similar to the first grating separated from the first grating by a second insulator and shifted with respect to the first grating in a direction orthogonal to the strip direction.

According to an embodiment, the pixels have a structure with three metal levels, said other metal level corresponding to the third metal level of said structure.

According to an embodiment, the distance between the first optical grating and the second optical grating is close to half the Talbot length, one Talbot length, or two or three times the Talbot length.

According to an embodiment, said pixels are self-focusing pixels.

According to an embodiment, said pixels are used to recenter light rays having a non-zero average angle of incidence.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

Figure 1:
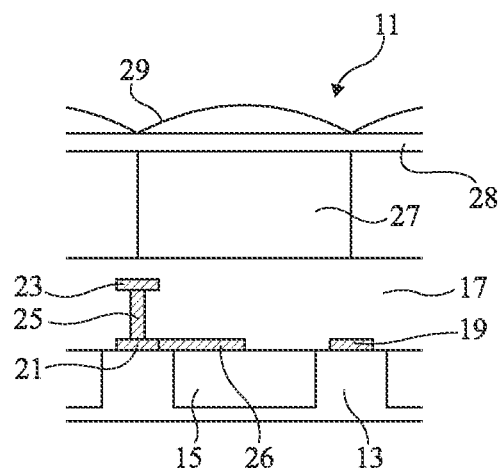
FIG. 1, previously described, is a cross-section view showing the structure of a self-focusing pixel screened on the left-hand side of an image sensor.

For clarity, the same elements have been designated with the same reference numerals in the various drawings and, further, the various drawings are not to scale.

Figure 5A:
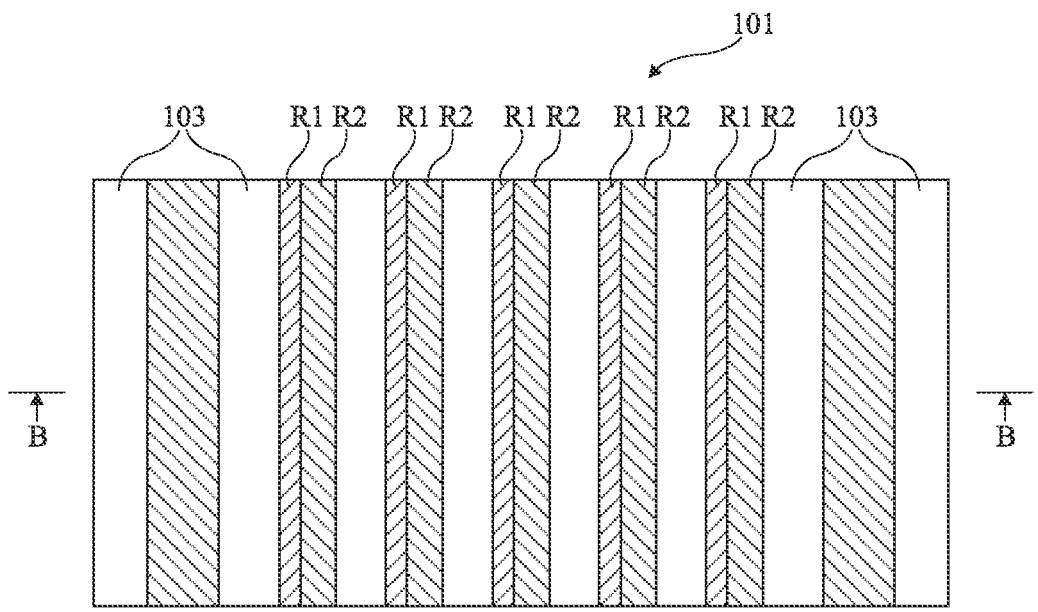
FIG. 5A is a top view showing an embodiment of a pixel intended to receive light rays with a non-zero average angle of incidence coming from the left-hand side of the pixel.
Figure 5B:
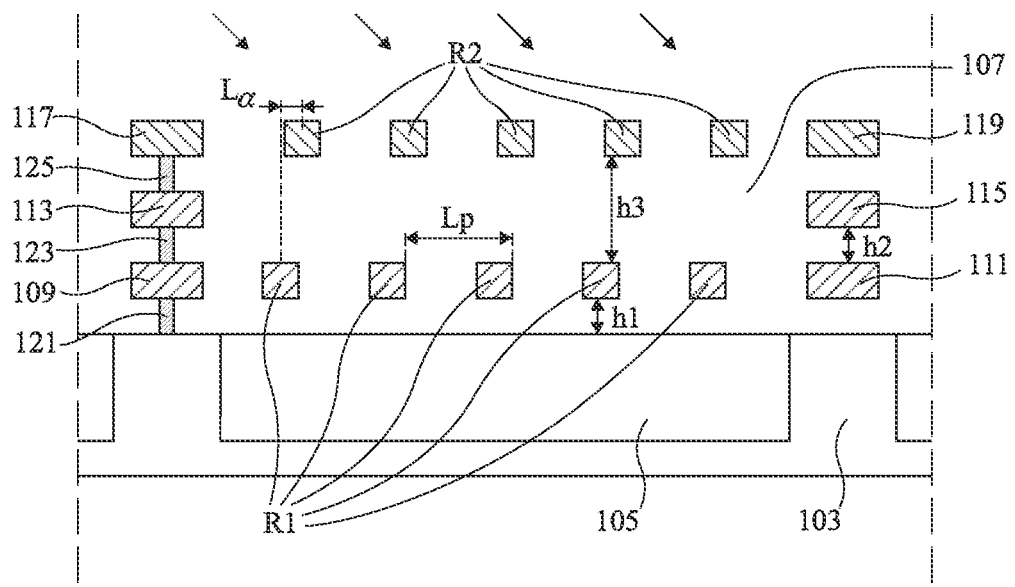
FIG. 5B is a cross-section view along plane B-B of FIG. 5A.

FIG. 5A is a top view and FIG. 5B is a cross-section view along plane B-B of FIG. 5A. These drawings show a pixel 101. Pixel 101 corresponds to a portion of the surface of a semiconductor substrate 103. Pixel 101 comprises an active photodiode area 105 formed in the upper part of substrate portion 103.

Substrate 103 is covered with an interconnection stack, where the metal levels and vias are separated by transparent insulating layers 107. For example, the interconnection stack may comprise three metal levels interconnected by vias 121, 123, 125.

In a first metal level, arranged at a vertical distance h1 from substrate 103, tracks 109 and 111 are formed and arranged so as not to cover active area 105. A first diffraction grating R1 is formed above active area 105. Grating R1 is formed of strips of the first metal level having a pitch $L_p$ and parallel to one another.

In a second metal level, arranged at a vertical distance h2 from the first metal level, tracks 113 and 115 of the interconnection stack are formed and arranged so as not to cover active area 105.

In a third metal level, arranged at a vertical distance h3 from the first metal level, tracks 117 and 119 of the interconnection stack are formed and arranged so as not to cover active area 105. In a third metal level, a second diffraction grating R2 is formed above active area 105. Grating R2 has the same pitch $L_p$ and the same orientation as grating R1. Further, grating R2 is laterally shifted to the right with respect to grating R1 by a horizontal distance $L_\alpha$ shorter than pitch $L_p$ of the grating strips.

When such a pixel receives light rays, only rays located within a limited angular range around a specific incidence are transmitted to active area 105 of pixel 101. The specific angle of incidence is determined by lateral shifting $L_\alpha$ between gratings R1 and R2. In the case of pixel 101 where grating R2 is shifted to the right with respect to grating R1, the specific angle of incidence corresponds to rays originating from the left, designated with arrows.

Vertical distance h3 between gratings R1 and R2 should be as close as possible to a value $h_T$ corresponding to a multiple of the Talbot length (well known to those skilled in the art; see, for example, H. F. Talbot, "Facts relating to optical science" No. IV, Philos. Mag. 9 (1836), incorporated herein by reference). Multiple means one Talbot length, half of this length or two or three times this length. This length can be calculated as follows:

$$h_T = (2*L_p^2)/\lambda,$$

where $L_p$ is the pitch between strips of a diffraction grating and $\lambda$ is the effective wavelength of the incident light rays in an insulator 107.

Figure 6A:
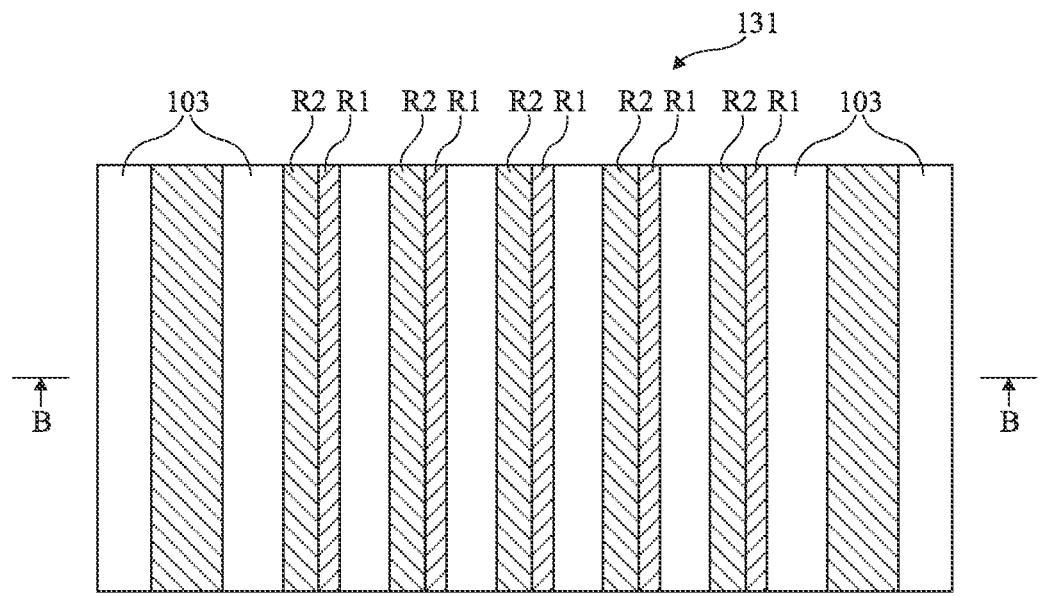
FIG. 6A is a top view showing an embodiment of a pixel intended to receive light rays with a non-zero average angle of incidence coming from the right-hand side of the pixel.
Figure 6B:
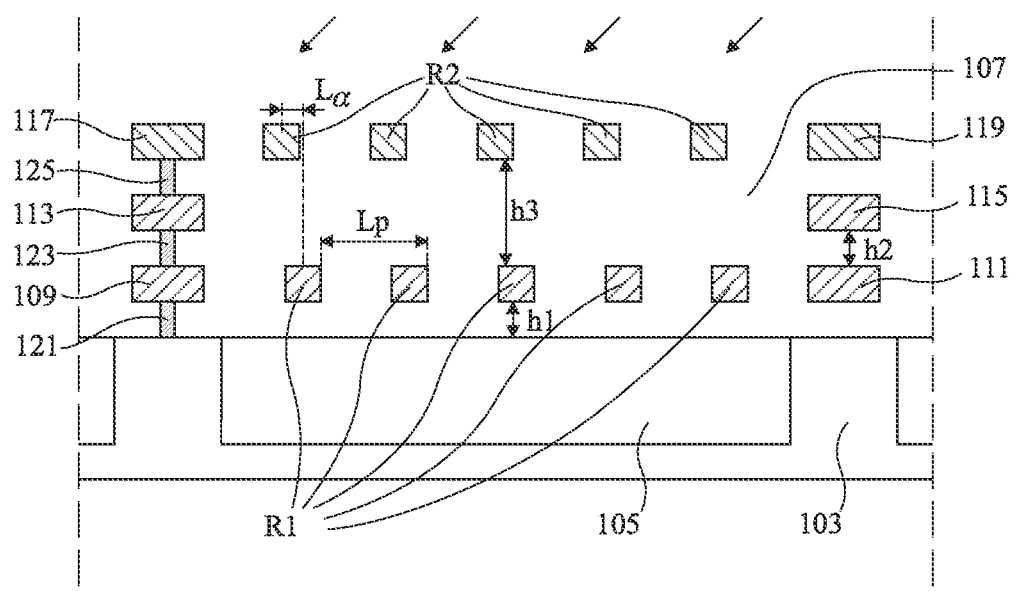
FIG. 6B is a cross-section view along plane B-B of FIG. 6A.

FIG. 6A is a top view and FIG. 6B is a cross-section view along plane B-B of FIG. 6A. These drawings show a pixel 131. The structure of pixel 131 is similar to the structure of pixel 101. However, diffraction grating R2 is laterally shifted to the left with respect to grating R1. In the case of pixel 131, the specific angle of incidence corresponds to rays coming from the right, designated with arrows.

An advantage of a pixel comprising two superposed laterally shifted diffraction gratings is that the metal levels used to form the diffraction gratings are the same as those used to manufacture the interconnection stacks. The forming of the gratings thus does not imply a specific manufacturing step.

Figure 2:
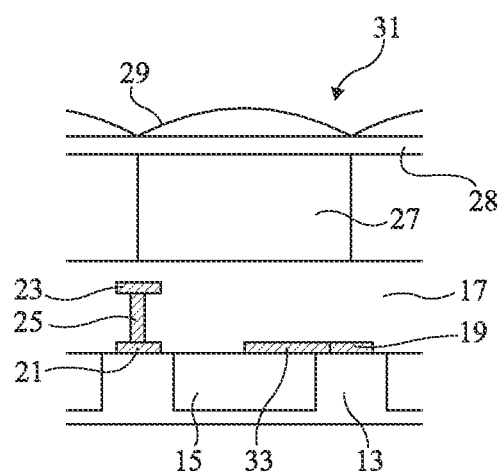
FIG. 2, previously described, is a cross-section view showing the structure of a self-focusing pixel screened on the right-hand side of an image sensor.

The previously-described pixels may be used as self-focusing pixels to replace the screened pixels described in relation with FIGS. 1 and 2.

Figure 3:
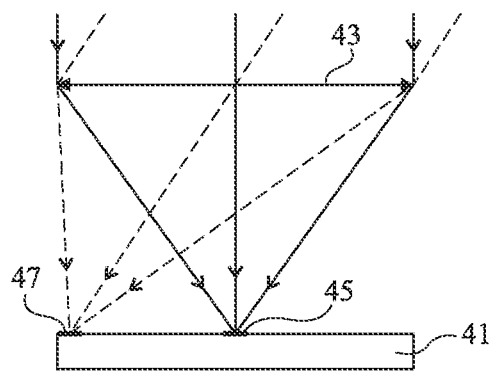
FIG. 3, previously described, is a very simplified cross-section view of an image sensor in the focal plane of a lens.
Figure 4:
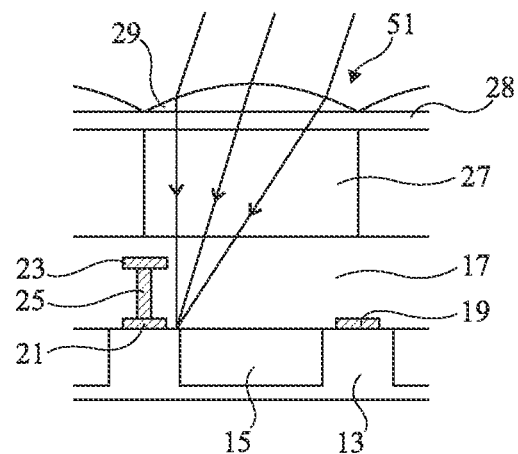
FIG. 4, previously described, is a cross-section view showing the structure of a "normal" pixel of the image sensor of FIG. 3.

Such pixels may also be used to overcome the vignetting problem discussed in relation with FIGS. 3 and 4.

FIG. 3, previously described, illustrates an image sensor having its pixels located at the sensor border receiving rays having a non-zero average angle of incidence. By using pixels, such as the pixel described in relation with FIG. 4, at the border of an image sensor, rays having a non-zero average angle of incidence are off-centered with respect to the active area, which results in an attenuation of the relative illumination. By using a pixel such as previously described at the border of an image sensor, the shifting of the gratings may be adjusted to compensate for this attenuation due to the non-zero angle of incidence.

Figure 7:
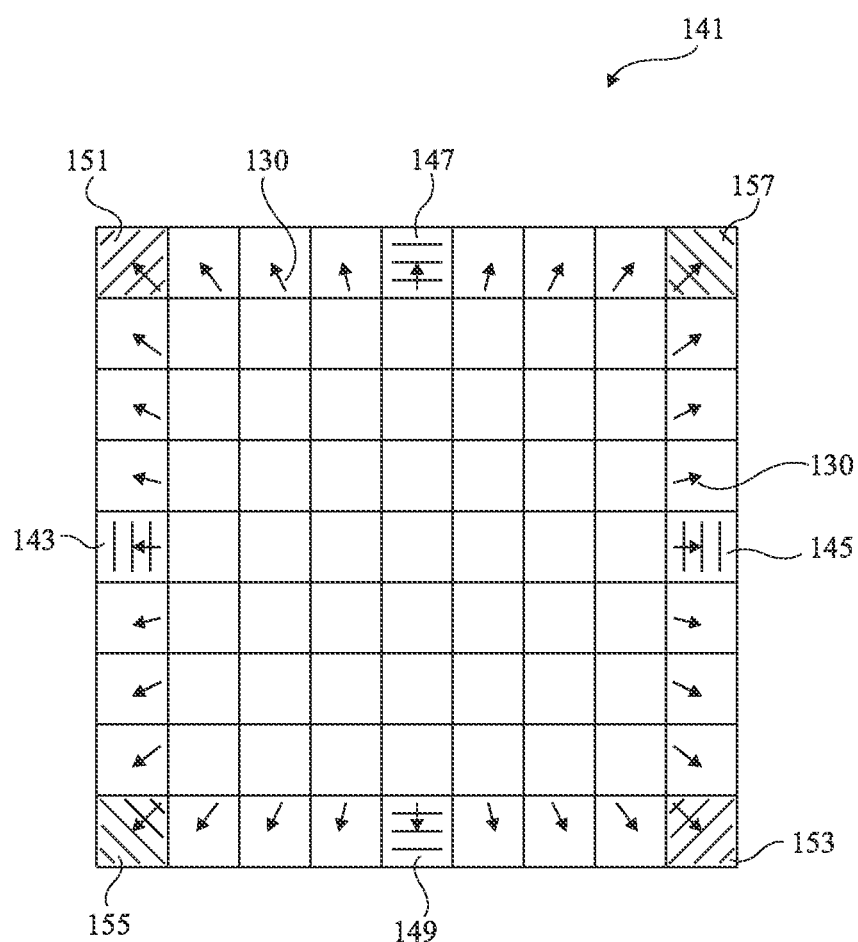
FIG. 7 is a top view showing an embodiment of an image sensor.

FIG. 7 is a top view showing an embodiment of a square image sensor comprising square pixels. The image sensor is located in the focal plane of a lens. The pixels located at the border of the image sensor comprise two stacked laterally shifted diffraction gratings, such as gratings R1 and R2 of FIGS. 5A, 5B and 6A, 6B. Gratings R1 and R2 are oriented according to the pixel location on the image sensor.

Arrows 130 illustrate the projection of the average direction of the light rays received by each pixel located at the border of image sensor 141. The strips of gratings R1 and R2 of each pixel are perpendicular to the average direction of the rays received by each of the pixels. Further, grating R2 of each pixel is shifted towards the outside of the pixel with respect to grating R1 of the same pixel.

Central left-hand lateral pixel 143 is identical to pixel 101 of FIGS. 5A, 5B, and central right-hand lateral pixel 145 is identical to pixel 131 of FIGS. 6A, 6B.

Upper and lower central pixels 147 and 149 are identical to pixels 143 and 145 having their gratings R1 and R2 rotated by 90°.

Gratings R1 and R2 of diagonal pixels 151, 153, 155, 157 are oriented by 45° with respect to pixels 143 to 149.

Due to this arrangement, the average maximum transmission angle of the gratings compensates for that due to vignetting. In the embodiment described in relation with FIG. 7, the pixels having diffraction gratings are located at the far edge of the image sensor. Of course, pixels with diffraction gratings may also be provided in a wider peripheral area of the image sensor.

As an example, to receive a light ray having a 550-nm wavelength (green) with a 10° angle of incidence coming from the left, two stacked diffraction gratings may be used, with the following dimensions:
 a pitch Lp of 600 nm;
 strips having a 200-nm width and a 200-nm thickness;
 a shifting to the right of grating R2 with respect to grating R1 by 150 nm;
 a distance h3 between the two gratings of 600 nm; and
 a distance h1 between grating R1 and the active area of 500 nm.

Specific embodiments have been described. Various alterations and modifications will occur to those skilled in the art.

In particular, the pixels described in relation with FIGS. 5A, 5B and 6A, 6B have a structure with three metal levels. First grating R1 is formed in the first metal level and second grating R2 is formed in the third metal level. The pixels may have a structure with two metal levels or more than three metal levels. The two metal levels having the diffraction gratings formed therein should then be spaced apart by a distance close to half the Talbot length, one Talbot length, of two or three times the Talbot length.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An image sensor, comprising:
    a pixel array including a plurality of pixels,
    wherein each pixel comprises an active photodiode area and a structure over the active photodiode area comprising:
        a first metal level including a first optical grating for the corresponding active photodiode area formed of periodically spaced apart parallel strips that are positioned to partially block light from reaching the corresponding active photodiode area and are separated from the corresponding active photodiode area by a first insulator;
        a second metal level including a second optical grating for the corresponding active photodiode area formed of periodically spaced apart parallel strips that are positioned to partially block light from reaching the corresponding active photodiode area and are separated from the first grating by a second insulator, and
        a third metal level positioned between the first and second metal levels;
    wherein the second optical grating is shifted with respect to the first grating in a direction orthogonal to a longitudinal direction of the strips.

2. The image sensor of claim 1, wherein no metal structures of the third metal level are positioned between the first and second optical gratings.

3. The image sensor of claim 1, wherein a distance between the first optical grating and the second optical grating is selected from the group consisting of approximately one-half of the Talbot length, approximately one Talbot length, or approximately two or three times the Talbot length.

4. The image sensor of claim 1, wherein said pixels are self-focusing pixels.

5. The image sensor of claim 1, wherein said pixels are used to recenter light rays having a non-zero average angle of incidence.

6. An imaging pixel, comprising:
    a substrate including an active area with a photosensitive region;
    a first metal level above the substrate, the first metal layer including a first optical grating formed of periodically spaced apart parallel strips;
    a second metal level above the substrate and the first metal level, the second metal layer including a second optical grating formed of periodically spaced apart parallel strips; and
    a third metal level between the first and second metal levels, said third metal level not including an optical grating;
    wherein the second optical grating is vertically shifted with respect to the first optical grating in a direction perpendicular to a top surface of the substrate by a first distance; and
    wherein the second optical grating is horizontally shifted with respect to the first optical grating in a direction parallel to the top surface of the substrate by a second distance.

7. The imaging pixel of claim 6, wherein the periodically spaced apart parallel strips of the first optical grating and the periodically spaced apart parallel strips of the second optical grating having a same pitch.

8. The imaging pixel of claim 6, wherein the first distance is approximately equal to one-half of the Talbot length.

9. The imaging pixel of claim 6, wherein the first distance is approximately equal to one Talbot length.

10. The imaging pixel of claim 6, wherein the first distance is approximately equal to N times the Talbot length, wherein N is equal to two or three.

11. The imaging pixel of claim 6, wherein the periodically spaced apart parallel strips of the first and second optical gratings longitudinally extend parallel to each other.

12. The imaging pixel of claim 11, wherein the periodically spaced apart parallel strips of the first and second optical gratings longitudinally extend in a direction perpendicular to a direction of received light rays with a non-zero average angle of incidence.

13. An image sensor, comprising:
    a pixel array including a plurality of pixels,
    wherein each pixel comprises an active area and a structure over the active area comprising:
        a first metal level including a first optical grating formed of periodically spaced apart parallel strips that are separated from the active area by a first insulator;
        a second metal level including a second optical grating formed of periodically spaced apart parallel strips separated from the first grating by a second insulator, and
        a third metal level positioned between the first and second metal levels;
    wherein the second optical grating is shifted with respect to the first grating in a direction orthogonal to a longitudinal direction of the strips; and
    wherein no metal structures of the third metal level are positioned between the first and second optical gratings.

14. The image sensor of claim 13, wherein a distance between the first optical grating and the second optical grating is selected from the group consisting of approximately one-half of the Talbot length, approximately one Talbot length, or approximately two or three times the Talbot length.

15. The image sensor of claim 13, wherein said pixels are self-focusing pixels.

16. The image sensor of claim 13, wherein said pixels are used to recenter light rays having a non-zero average angle of incidence.

17. An image sensor, comprising:
    a first active photodiode area in a substrate;
    a second active photodiode area in the substrate;
    a first metal level above the substrate;
    a second metal level above the substrate and the first metal level;
    a third metal level between the first and second metal levels;
    a first optical grating structure above the first active photodiode area, wherein the first optical grating structure comprises:

a first optical grating formed of periodically spaced apart parallel strips of the first metal level; and
a second optical grating formed of periodically spaced apart parallel strips of the second metal level;
a second optical grating structure above the second active photodiode area, wherein the second optical grating structure comprises:
a third optical grating formed of periodically spaced apart parallel strips of the first metal level; and
a fourth optical grating formed of periodically spaced apart parallel strips of the second metal level.

18. The image sensor of claim 17:
wherein the second and fourth optical gratings are vertically shifted with respect to the first and third optical gratings in a direction perpendicular to a top surface of the substrate by a first distance; and
wherein the second and fourth optical gratings are horizontally shifted with respect to the first and third optical gratings in a direction parallel to the top surface of the substrate by a second distance.

19. The image sensor of claim 17, wherein the first and second active photodiode areas are pixels in an array, and wherein the periodically spaced apart parallel strips in each pixel are oriented perpendicular to an average direction of light rays received by the pixel.

20. The image sensor of claim 19, wherein the second and fourth optical gratings are horizontally shifted with respect to the first and third optical gratings in a direction parallel to the top surface of the substrate away from a center of the array.

* * * * *